(12) United States Patent
Negoi

(10) Patent No.: US 8,026,556 B2
(45) Date of Patent: Sep. 27, 2011

(54) ADJUSTABLE RESISTOR FOR USE IN A RESISTIVE DIVIDER CIRCUIT AND METHOD FOR MANUFACTURING

(75) Inventor: Andy C. Negoi, Crolles (FR)

(73) Assignee: NXP B.V., Eindhoven (NL)

( * ) Notice: Subject to any disclaimer, the term of this patent is extended or adjusted under 35 U.S.C. 154(b) by 201 days.

(21) Appl. No.: 12/297,281

(22) PCT Filed: Apr. 19, 2007

(86) PCT No.: PCT/IB2007/051409
§ 371 (c)(1),
(2), (4) Date: Oct. 15, 2008

(87) PCT Pub. No.: WO2007/122561
PCT Pub. Date: Nov. 1, 2007

(65) Prior Publication Data
US 2009/0174033 A1    Jul. 9, 2009

(30) Foreign Application Priority Data
Apr. 21, 2006   (EP) ..................................... 06300393

(51) Int. Cl.
*H01L 27/01* (2006.01)
(52) U.S. Cl. ................ 257/380; 257/538; 257/E27.047; 257/E27.071; 257/E21.006; 257/904; 438/382; 438/538; 438/612; 438/664; 438/666

(58) Field of Classification Search .................. 438/382, 438/612, 664, 666, 682, 683, 696; 257/380, 257/538, E27.047, E27.071, E21.006, 904
See application file for complete search history.

(56) References Cited

U.S. PATENT DOCUMENTS

| | | | |
|---|---|---|---|
| 4,181,878 A | 1/1980 | Coccetti et al. | |
| 4,219,797 A * | 8/1980 | Huang | ........................... 338/333 |
| 5,247,262 A | 9/1993 | Cresswell et al. | |
| 5,656,524 A | 8/1997 | Eklund et al. | |
| 6,087,189 A | 7/2000 | Huang | |
| 6,356,223 B1 | 3/2002 | Tanaka | |
| 6,369,736 B2 | 4/2002 | Tran et al. | |
| 6,730,554 B1 | 5/2004 | Baldwin et al. | |
| 2004/0196063 A1 * | 10/2004 | Wong et al. | ...................... 326/30 |
| 2004/0235258 A1 | 11/2004 | Wu et al. | |
| 2005/0140534 A1 | 6/2005 | Nishi et al. | |
| 2005/0170644 A1 | 8/2005 | Sasaki | |
| 2007/0111522 A1 * | 5/2007 | Lim et al. | ....................... 438/682 |
| 2009/0174033 A1 * | 7/2009 | Negoi | ........................... 257/537 |
| 2010/0103494 A1 * | 4/2010 | Moidu | ........................ 359/225.1 |

FOREIGN PATENT DOCUMENTS
WO    2005043605 A1    5/2005

* cited by examiner

*Primary Examiner* — George Fourson, III

(57) ABSTRACT

A method of manufacturing a resistive divider circuit, includes providing a silicon body having a plurality of opposing pairs of intermediate taps extending therefrom. Each tap comprises a thin silicon stem supporting a relatively wider silicon platform. A silicidation protection (SIPROT) layer is deposited over the body and intermediate taps and then patterned to expose the platform. A silicidation process is performed to silicidate the platform to form a contact pad of relatively low resistivity.

4 Claims, 3 Drawing Sheets

ADJUSTABLE RESISTOR FOR USE IN A RESISTIVE DIVIDER CIRCUIT AND METHOD FOR MANUFACTURING

This invention relates generally to a resistive divider circuit, and method of manufacturing same.

Digital to analog converters with non-linear transfer characteristics are typically used in source (or column) IC drivers for TFT (thin film transistor) LCD displays for computer monitors, LCD television sets, mobile telephones, and the like. A typical display module is illustrated schematically in FIG. 1 of the drawings and comprises a liquid crystal (LC) cell 100 sandwiched between two glass plates 102a, 102b. Display driver Ics, namely source or column drivers 106 and gate or row drivers 108, are mounted on the lower glass plate (or "active plate") 102a. A colour filter 104 is provided at the upper glass plate 102b, and the complete arrangement is sandwiched between a pair of polarizers 109a,b. The display module is mounted over a lightguide 110 and backlight 112. The configuration described above and illustrated in FIG. 1 of the drawings can be built, for example, in small portable devices, such as cellular telephones and Personal Digital Assistants (PDAs).

A schematic circuit diagram illustrating the general configuration of a resistive divided digital to analog converter (DAC), comprising a chain of resistors R1, R2, ... RN connected across a voltage supply V0-V255 with voltage taps V1, V2, ... provided between each resistor. Digital to analog conversion in the source (or column) drivers of a TFT display requires a monotonic transfer characteristic, which is non-linear. Therefore, the resistors in the chain are not equal. Furthermore, with ever-increasing colour depth, for each sub-pixel (for red, green and blue primary colours respectively) there may be a code of 6, 8 or even 10 or more bits, each requiring a respective voltage tap. Thus, the requirement for precision is ever-increasing, and this cannot be traded off against IC area.

Referring to FIG. 3 of the drawings, there is illustrated a typical layout implementation of a polysilicon resistor chain for use in a source display driver according to the prior art. In general, a layer of silicon nitride and a layer of silicon oxide are deposited on a polysilicon body 10, and these layers are patterned by lithography to expose parts of the IC to be silicidated, whereas the parts of the body not to be silicidated remain covered by these layers. A titanium layer is then deposited and thermally heated, so it reacts with exposed silicon to form silicide only in the parts not covered by the silicon nitride and silicon oxide layers. The titanium that has not reacted with silicon (in the parts covered by the above-mentioned layers) is subsequently removed. The silicidated parts have a law resistivity for electrically contacting the silicon layer by a metal contact (to form the voltage taps) and the non-silicidated silicon has a relatively low conductivity and mainly determines the resistance value of each resistor R. The patterned layer of silicon nitride and the patterned layer of silicon oxide form a so-called silicidation protection mask, also referred to as a SIPROT mask S.

The main problem encountered in relation to the layout of FIG. 3 is that for each resistor R in the chain, the main current I will cross two interfaces having parasitic resistances that are not very well controlled. Referring additionally to FIG. 4 of the drawings, an interface is defined at each point where the SIPROT mask S crosses with the polysilicon mask. In FIG. 4, it is illustrated that as a result of the interface between the polysilicon and silicided polysilicon, a small region 12 is created where defects in the crystalline structure affect the electrical behaviour on the surface between the resistor body (i.e. the high ohmic part) 14 and the silicide 16 (i.e. the low ohmic part of the resistor head).

The layout illustrated in FIG. 3 can only operate acceptably if the requirement for precision is not very high and the width of the resistor R can be sized such that the head parasitic resistance (contacts, silicided polysilicon 16 and the interface with the resistor body 14) is negligible with regard to the designed resistor value. The value of the polysilicon resistor shown in FIG. 3 is:

$$R=((a+b)/W_{eff}) \times (R_{polycide}) + 2 \times (R_{interface})/W_{eff} + (L/W_{eff}) \times (R_{unsilicated\ poly})$$

and, in a typical exemplary embodiment, the interface could contribute, for example, $2 \times 100$ Ohms $\mu m/30\ \mu m = 6.67$ Ohms, for a body resistance of 9 $\mu m/30\ \mu m \times 145$ ohms=43.5 Ohms (where L=9 $\mu m$, $W_{eff}$=30 $\mu$, $R_{interface}$=100 ohms $\mu m$ and $R_{unsilicided\ poly}$=145 Ohms). Thus, it is clear that, using modern processes with silicided polysilicon, the interface resistance between the head 16 and the body 14 plays a major role and this process parameter cannot be tightly controlled. Errors due to process variations will limit the precision of the transfer characteristic which would, in turn, be observed in the quality of the display.

Another typical layout of a resistor for increased precision is illustrated schematically in FIG. 5. In this configuration broad polysilicon contact pads 18 (having dark squares representative of contacts 19 to metal) are provided on relatively narrow polysilicon taps 20 extending from the horizontal resistor body 14. This layout is well-known and widely applied for building high precision DACs, primarily with constant voltage difference between two neighbouring taps 20. Because the interface (again the cross of the SIPROT mask S with the polysilicon mask) occurs at the taps 20, rather than in the main current path, the resultant parasitic resistance does not contribute to the resistance of the body, so the divider is accurate. However, this parasitic resistance at each tap 20 can still have an adverse effect on performance, which is not necessarily predictable. In one exemplary embodiment, the interface resistance might be 2 (i.e. 2 heads)$\times 100$ Ohms $\mu m/0.5\ \mu m$=400 Ohms. Top parasitic resistances of, say 200 ohms together with some amplifier input capacitance could result in RC time constants that cause some timing problems in the system at high speeds.

It is therefore preferred to provide a high precision resistive divider circuit in which the parasitic resistance of the intermediate taps is significantly reduced relative to the prior art.

In accordance with the present invention, there is provided a method of manufacturing an integrated circuit comprising a resistive divider circuit, the method comprising providing a silicon body having an intermediate tap extending therefrom, the tap comprising a silicon stem supporting a relatively wider silicon platform, forming a silicidation protection layer over said silicon body and intermediate tap and patterning said silicidation protection layer such that said silicon platform is exposed, and performing a silicidation process so as to silicidate said exposed platform to form a respective contact pad of relatively low resistivity.

Thus, the above-mentioned object of the invention is achieved by making the interface (i.e. the intersection between the SIPROT layer and the polysilicon layer) longer than that in the prior art arrangement described with reference to FIG. 5. Since the interface resistance between the polysilicon covered with SIPROT (i.e. silicidation protection layer) and the silicided polysilicon (for interconnections) is inversely proportional to the length of the SIPROT mask interface, by making the interface longer, the parasitic resistance caused by the interface is significantly reduced relative to the prior art.

In a preferred embodiment, a plurality of said intermediate taps are provided in spaced-apart relation, wherein the width of sections of said silicon body between adjacent stems defines the resistance thereof.

In one exemplary embodiment, the interface between the non-silicidated platform and the silicidated contact pad is of a meandering configuration, which has the effect of further increasing the effective length of the interface and, therefore, decreasing the parasitic resistance thereof.

Preferably, two of said intermediate taps, one each on opposing sides of said silicon body, are provided between each resistor. Each of the intermediate taps will have a parasitic interface resistance, and these parasitic resistances will be in parallel, thus the effective overall resistance is further reduced.

Also in accordance with the present invention, there is provided an integrated circuit comprising a resistive divider circuit having a silicon body with an intermediate tap extending therefrom, the tap comprising a silicon stem supporting a relatively wider silicon platform, wherein said platform comprises a non-silicidated portion coupled to said silicon body and a silicidated external contact portion with an interface between said non-solicidated and solicidated portions.

These and other aspects of the present invention will be apparent from, and elucidated with reference to, the embodiments described herein.

Embodiments of the present invention will now be described by way of examples only and with reference to the accompanying drawings, in which.

Figure 6:
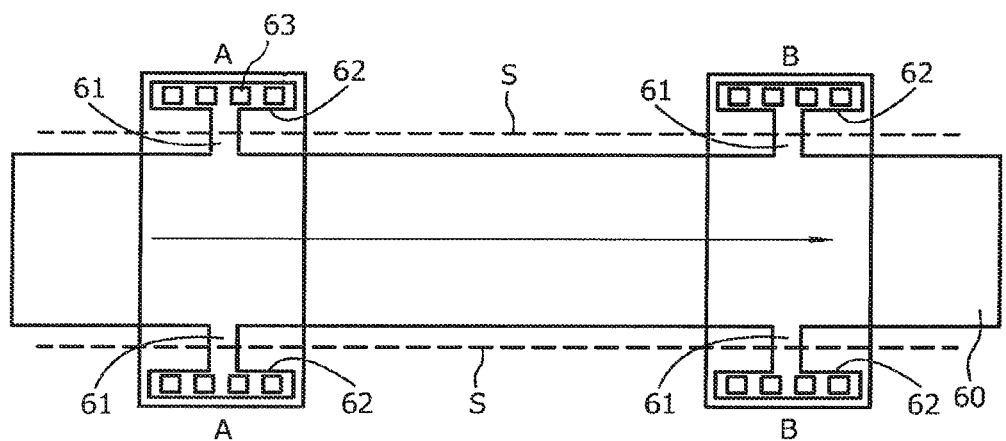
FIG. 6 is a schematic cross-sectional view of a resistive divider circuit according to a first exemplary embodiment of the present invention.

Referring to FIG. 6 of the drawings, a resistive divider circuit according to a first exemplary embodiment of the invention comprises a polysilicon body 60 having a relatively high resistivity. The polysilicon body 60 is etched to form intermediate tap portions 61 on each of which is supported a relatively broader polysilicon platform 62. A silicidation protection (SIPROT) layer S is then deposited over the body 60 and patterned by lithography to expose the polysilicon platforms 62. Next, a titanium layer is deposited and thermally treated so it reacts with the exposed polysilicon of the platforms 62 to form silicide (of relatively low resistivity), thereby creating respective contact pads A, B (i.e. the parts shown in FIG. 6 with black squares 63 representing contacts to metal). The position of the tap portions 61 determines the resistance of the polysilicon body therebetween, and it is a significant advantage of the illustrated layout that it is possible to make adjustments to the location of the tap portions 61 relative to the polysilicon body 60, so as to adjust the resistance thereof accordingly, with only one mask adjustment (at the polysilicon etching stage). Thus, a very precise tap can be made on the main body, which can be moved to the left or right to adjust the transfer characteristic of the device with only one mask change. It is not necessary to modify the contact or metal masks to make small adjustments: simply by moving the relatively small polysilicon tap portions 61 (within the limits of the broad contact heads 61), the DAC transfer curves can be adjusted precisely.

By placing the interface line (defined by the SIPROT layer S in FIG. 6) in the resistor heads A, B, the parasitic resistance associated therewith is not in the main current path, and does not affect the accuracy of the device, and the length of the interface is significantly increased relative to the prior art arrangement described above with reference to FIG. 5, such that the parasitic resistance associated with the interface is significantly reduced accordingly. It will be appreciated from FIG. 6, that in accordance with an exemplary embodiment of the present invention, it is proposed to provide two heads A, B in respect of each intermediate tap, one on each side of the polysilicon body 60. Each head has substantially the same parasitic resistance (contact+silicided region+interface) and, by providing one head on each side of the body 60, the resultant respective parasitic resistances are in parallel, and therefore the overall parasitic resistance is halved.

Figure 7:
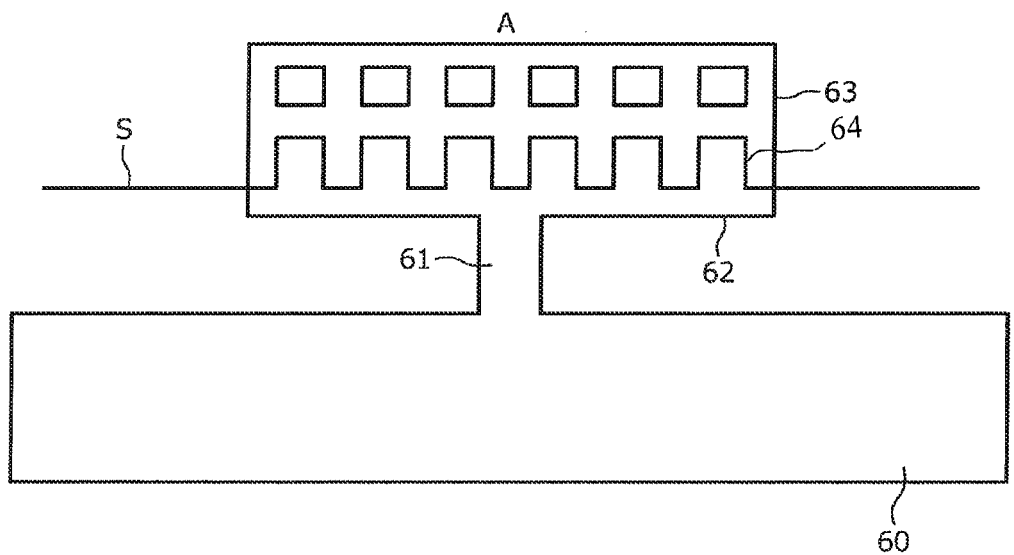
FIG. 7 is a schematic cross-sectional view of a resistive divider circuit according to a second exemplary embodiment of the present invention.

In an alternative exemplary embodiment of the present invention, referring to FIG. 7 of the drawings, the SIPROT border length can be maximised by first etching the polysilicon platform 62 to form a series of notches or grooves 64 therein, and then depositing and patterning the SIPROT layer S, such that a meandering interface is achieved. The overall length of the interface is therefore further increased relative to the case where the interface is a straight line, and the resultant parasitic resistance is further decreased accordingly. Once again, fine tuning of the device transfer characteristics can be achieved simply by moving the polysilicon tap portions 61 relative to the body 60 (within the constraints of the broader contact pad A).

Figure 5:
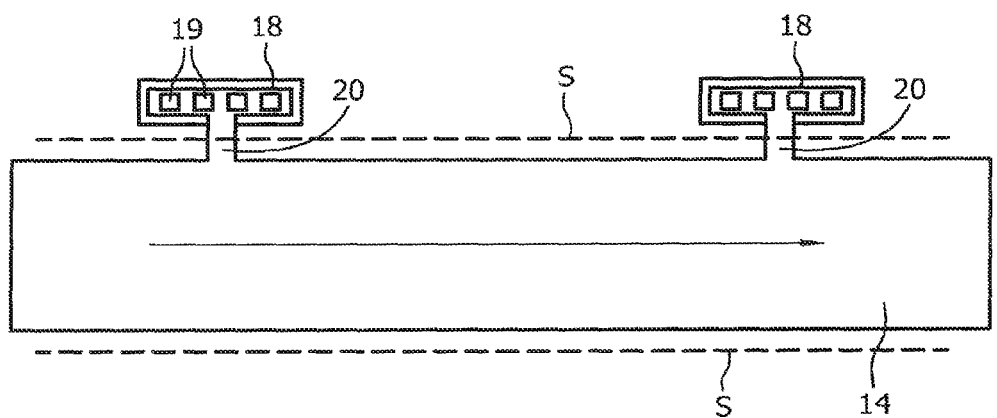
FIG. 5 is a schematic cross-sectional view of a resistive divider circuit having a second, known layout.

In the embodiment of FIG. 6, the head resistance is improved (relative to the prior art arrangement described with reference to FIG. 5) by the ratio of the SIPROT length to the width of the narrow tap portion 61, i.e. instead of a resistance of 200 Ohms per tap, only 20 Ohms (thus, the parasitic resistance associated with each tap can be reduced by a factor of 10). In the embodiment of FIG. 7, the parasitic resistance associated with each tap can be further reduced by a factor of, say, 1.5 or even 2 relative to the arrangement of FIG. 6, i.e. the interface resistance associated with each tap may only be 10 to 15 Ohms.

Thus, the present invention proposes a new layout technique for a resistive divider circuit (for use in a DAC), which is flexible enough to enable dividing ratios to be changed within certain limits (set by the width of the contact pads), changing only one process step (i.e. one mask) and minimising the parasitic resistance of the intermediate taps.

Figure 1:
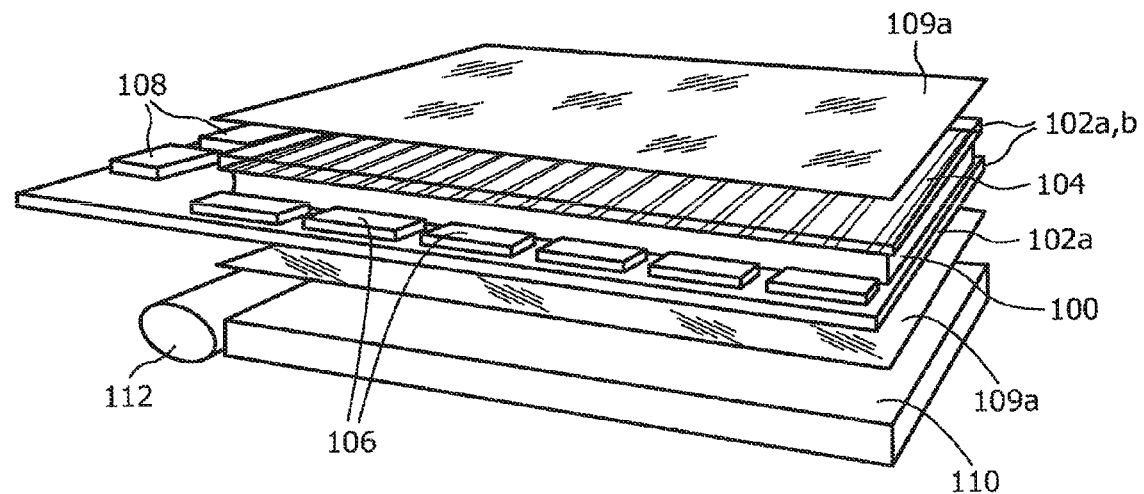
FIG. 1 is a schematic diagram illustrating the basic configuration of a display module in which a digital to analog converter including a resistive divider circuit according to an exemplary embodiment of the present invention.
Figure 2:
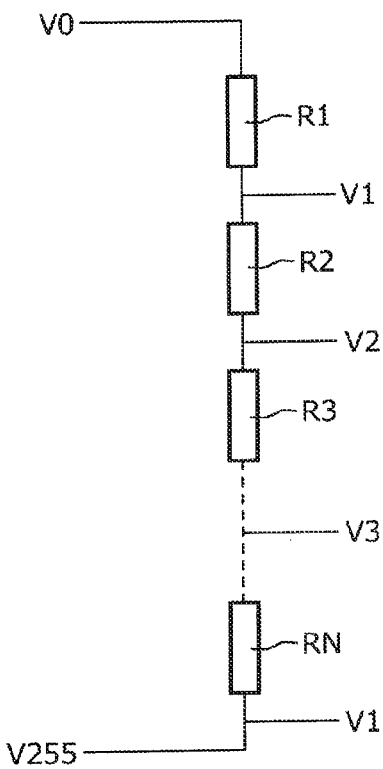
FIG. 2 is a schematic circuit diagram illustrating the basic configuration of a resistive divider circuit.
Figure 3:
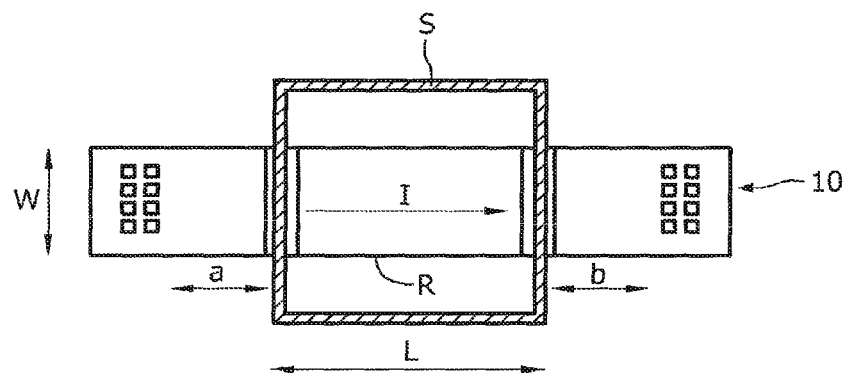
FIG. 3 is a schematic plan view of a resistive divider circuit having a first, known layout.
Figure 4:
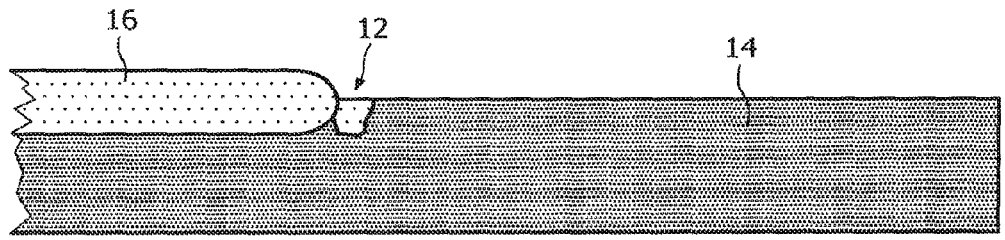
FIG. 4 is a schematic cross-sectional view of a portion of the device illustrated in FIG. 3, illustrating the effect of the interface between silicidated and non-silicidated polysilicon.

In summary, the exemplary embodiments of the invention described above propose respective layouts in respect of a high precision voltage divider for use in building a digital to analog converter which provides bias levels to be switched on every column of pixels of an active matrix TFT LCD display of the type described above with reference to FIG. 1. The bias levels are not equally spaced relative to each other, so the DAC must have a nonlinear transfer characteristic. The curves of the transfer characteristic are dependent on the liquids used by the TFT LCD panel maker. Because of this nonlinearity, the precision of the voltage divider depends on the accuracy of the individual resistors with different values, which are affected in conventional methods by the resistor head parasitic interface resistances. The present invention proposes a layout technique which makes the resistor head parasitic interface resistance negligible with respect to the main body resistance. As a result, more freedom is offered with regard to sizing of resistors for high precision (deep colour depth) modem LCD displays for flat television sets and computer screens. The proposed technique opens the way to further cost reductions (by choosing a smaller IC area for these resistor strings) in high precision (>8 bit) DACs with nonlinear transfer characteristics.

It should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. The invention may be implemented by means of hardware comprising several distinct elements, and by means of a suitably programmed computer. In a device claim enumerating several means, several of these means may be embodied by one and the same item of hardware. The mere fact that certain measures are recited in mutually different dependent claims does not indicate that a combination of these measures cannot be used to advantage.

In the description above, it will be understood that when an element such as layer, region or substrate is referred to as being "on" or "onto" another element, the element is either directly on the other element, or intervening elements may also be present.

A person skilled in the art will readily appreciate that various parameters disclosed in the description may be modified and that various embodiments disclosed and/or claimed may be combined without departing from the scope of the invention.

The invention claimed is:

1. A method of manufacturing an integrated circuit comprising a resistive divider circuit, the method comprising providing a silicon body having an intermediate tap extending therefrom, the tap comprising a silicon stem supporting a relatively wider silicon platform, forming a silicidation protection layer over said silicon body and intermediate tap and patterning said silicidation protection layer such that said silicon platform is exposed, and performing a silicidation process so as to silicidate said exposed platform to form a respective contact pad with an oscillating interface and of relatively low resistivity.

2. A method according to claim 1, wherein a plurality of said intermediate taps are provided in spaced-apart relation, wherein the width of sections of said silicon body between adjacent stems defines the resistance thereof.

3. A method of manufacturing an integrated circuit comprising a resistive divider circuit, the method comprising providing a silicon body having an intermediate tap extending therefrom, the tap comprising a silicon stem supporting a relatively wider silicon platform, forming a silicidation protection layer over said silicon body and intermediate tap and patterning said silicidation protection layer such that said silicon platform is exposed, and performing a silicidation process so as to silicidate said exposed platform to form a respective contact pad of relatively low resistivity, wherein the interface between the non-silicidated platform and the silicidated contact pad has a meandering configuration.

4. An integrated circuit comprising a resistive divider circuit having a silicon body with an intermediate tap extending therefrom, the tap comprising a silicon stem supporting a relatively wider silicon platform, wherein said platform comprises a non-silicidated portion coupled to said silicon body and a silicidated external contact portion with oscillating interface between said non-silicided and silicided portions.

* * * * *